(12) United States Patent
Cheng et al.

(10) Patent No.: US 9,773,905 B2
(45) Date of Patent: Sep. 26, 2017

(54) STRAINED FINFET BY EPITAXIAL STRESSOR INDEPENDENT OF GATE PITCH

(71) Applicant: INTERNATIONAL BUSINESS MACHINES CORPORATION, Armonk, NY (US)

(72) Inventors: Kangguo Cheng, Schenectady, NY (US); Pouya Hashemi, White Plains, NY (US); Ali Khakifirooz, Los Altos, CA (US); Alexander Reznicek, Troy, NY (US); Charan V. V. S. Surisetty, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 102 days.

(21) Appl. No.: 14/822,965

(22) Filed: Aug. 11, 2015

(65) Prior Publication Data

US 2015/0349123 A1 Dec. 3, 2015

Related U.S. Application Data

(62) Division of application No. 14/197,433, filed on Mar. 5, 2014.

(51) Int. Cl.
| | |
|---|---|
| *H01L 21/336* | (2006.01) |
| *H01L 29/66* | (2006.01) |
| *H01L 29/78* | (2006.01) |
| *H01L 29/10* | (2006.01) |
| *H01L 27/088* | (2006.01) |

(Continued)

(52) U.S. Cl.
CPC .. *H01L 29/7848* (2013.01); *H01L 21/823431* (2013.01); *H01L 21/845* (2013.01); *H01L 27/0886* (2013.01); *H01L 29/1087* (2013.01); *H01L 29/6681* (2013.01); *H01L 29/785* (2013.01)

(58) Field of Classification Search
CPC ............ H01L 29/785; H01L 29/66795; H01L 29/6681; H01L 27/0886; H01L 29/0673
See application file for complete search history.

(56) References Cited

U.S. PATENT DOCUMENTS

| | | |
|---|---|---|
| 6,770,516 B2 | 8/2004 | Wu et al. |
| 7,795,669 B2 | 9/2010 | Georgakos et al. |
| 7,919,364 B2 | 4/2011 | Sonsky et al. |

(Continued)

*Primary Examiner* — Bradley K Smith
*Assistant Examiner* — David Goodwin
(74) *Attorney, Agent, or Firm* — Matthew C. Zehrer

(57) ABSTRACT

A semiconductor device is fabricated by forming a fin and a plurality of gates upon a semiconductor substrate, forming sacrificial spacers upon opposing gate sidewalls, forming a mask upon an upper surface of the fin between neighboring gates, removing the sacrificial spacers, recessing a plurality of regions of the fin to create a dummy fin and fin segments, removing the mask, and epitaxially merging the dummy fin and fin segments. The fins may be partially recessed prior to forming the sacrificial spacers. The device may include the substrate, gates, fin segments each associated with a particular gate, the dummy fin between a fin segment pair separated by the wider pitch, and merged epitaxy connecting the dummy fin and the fin segment pair. The dummy fin may serve as a filler between the fin segment pair and may add epitaxial growth planes to allow for epitaxial merging within the wider pitch.

20 Claims, 9 Drawing Sheets

(51) Int. Cl.
  *H01L 21/8234* (2006.01)
  *H01L 21/84* (2006.01)

(56) References Cited

U.S. PATENT DOCUMENTS

| | | | |
|---|---|---|---|
| 8,035,170 | B2 | 10/2011 | Inaba |
| 8,169,009 | B2 | 5/2012 | Inaba |
| 8,440,517 | B2 | 5/2013 | Lin et al. |
| 8,617,996 | B1 | 12/2013 | Chi et al. |
| 8,658,536 | B1 | 2/2014 | Choi et al. |
| 8,697,515 | B2 | 4/2014 | Yin et al. |
| 8,802,521 | B1 | 8/2014 | Hung et al. |
| 8,835,268 | B2 | 9/2014 | Sudo |
| 9,029,930 | B2 | 5/2015 | Kelly et al. |
| 9,029,958 | B2 * | 5/2015 | Ho .................... H01L 29/66795 257/401 |
| 9,449,975 | B1 * | 9/2016 | Ching ................ H01L 27/0922 |
| 9,601,598 | B2 * | 3/2017 | Perng ................ H01L 29/165 |
| 2005/0242395 | A1 | 11/2005 | Chen et al. |
| 2007/0170521 | A1 * | 7/2007 | Abadeer ............ H01L 21/845 257/401 |
| 2007/0249174 | A1 * | 10/2007 | Yang .................. H01L 21/0334 438/712 |
| 2009/0050975 | A1 | 2/2009 | Bryant et al. |
| 2010/0052059 | A1 | 3/2010 | Lee |
| 2010/0109086 | A1 * | 5/2010 | Song .................. H01L 29/785 257/365 |
| 2013/0134513 | A1 * | 5/2013 | Standaert ............ H01L 29/785 257/347 |
| 2013/0175584 | A1 * | 7/2013 | Ho .................... H01L 29/66795 257/288 |
| 2013/0230953 | A1 | 9/2013 | Sudo |
| 2014/0231913 | A1 | 8/2014 | Leobandung |

\* cited by examiner

STRAINED FINFET BY EPITAXIAL STRESSOR INDEPENDENT OF GATE PITCH

FIELD

Embodiments of invention generally relate to semiconductor devices, design structures for designing a semiconductor device, and semiconductor device fabrication methods. More particularly, embodiments relate to semiconductor structures with strained FinFET by epitxial stressor independent of gate pitch.

BACKGROUND

There is difficulty in maintaining performance improvements in devices of deeply submicron generations. One general approach for improving performance is to try to increase carrier (electron and/or hole) mobilities. A promising avenue toward better carrier mobility is to apply tensile or compressive stress in the semiconductor channel regions. Typically, it may be preferable to have the channel of electron conduction type devices, such as NFET, in tensile stress, while to have the channel of hole conduction type devices, such as PFET, in compressive stress. In the case of the more common planar devices a method known in the art for stressing channels is the deposition of so called stress liners. Stress liners are insulating layers covering the devices, which layer are under stress, and then impart the stress onto the device channels. It is known that the stress distribution is such that if a stressing layer which covers a planar FET, is, for instance, in tensile stress, then the channel of the FET will also be under tensile stress, while the source and drain of the same device would be under compressive stress.

Applying stress to non-planar, three dimensional (3D) FETs, such as a FinFET, or Tri-Gate device, may be more difficult. Stress liners commonly used for planar devices are not very efficient, partly because of the 3D nature of the device, and partly because of the shrinking of the device pitch as technology progresses. Smaller device pitch leads to thinner stress liners, and that results in less channel stress. One way to increase the stress coupling to FinFET channel regions is to recess, namely etch down, the source/drain area of the fins or epitaxially grow material above and below the source/drain area of the fins.

In some semiconductor devices, gate pairs may be separated by a narrow pitch and other gate pairs may be separated by a wider pitch. Currently, during epitaxy growth, it is difficult to ensure that epitaxy merges the fins separated by the wider pitch to provide the strain benefit while also limiting epitaxy overgrowth between the fins separated by the narrow pitch.

SUMMARY

Embodiments of invention generally relate to semiconductor devices, and more particularly to design structures, semiconductor devices, and fabrication of semiconductor devices.

In a first embodiment of the present invention, a semiconductor device includes a semiconductor substrate, a plurality of fin segments upon the semiconductor substrate, a plurality of gates, each gate upon a particular fin segment, a dummy fin between a first fin segment pair separated by a first pitch, and merged epitaxy connecting the dummy fin and the first fin segment pair.

In another embodiment a semiconductor device includes a partially recessed semiconductor substrate, a plurality of fin segments upon the partially recessed semiconductor substrate, a plurality of gates, each gate upon a particular fin segment, a dummy fin between a first fin segment pair separated by a first pitch, and merged epitaxy connecting the dummy fin and the first fin segment pair.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments of invention generally relate to semiconductor devices, and more particularly to semiconductor structures utilizing FinFETs. A FinFET device may include a plurality of fins formed in a wafer and a gate covering a portion of the fins. The portion of the fins covered by the gate may serve as a channel region of the device. Portions of the fins may also extend out from under the gate and may serve as source and drain regions of the device. Semiconductor structures including FinFETs may be implemented with gate first or gate last FinFET fabrication process techniques. In gate first processes, metal layers over first structure areas (e.g. NMOS areas, etc.) and second structure areas (e.g. PMOS areas, etc.) are formed and patterned to form gate structures followed by typical CMOS processing such as forming of the source and drain, forming spacers and depositing of the interlevel dielectric. In a gate last process, a dummy gate structure is formed followed by typical CMOS processing including formation of the source and drain, formation of spacers and deposition of the interlevel dielectric. Thereafter, the dummy gate structure is removed followed by deposition of a replacement gate structure.

Referring now to the figures, exemplary process steps of forming a structure 10 in accordance with embodiments of the present invention are shown, and will now be described in greater detail below. It should be noted that some of the figures depict a cross section view of structure 10 oriented such that a view perpendicular to the lengths of a plurality of fins and parallel to a plurality of gates are depicted. Furthermore, it should be noted that while this description may refer to some components of the structure 10 in the singular tense, more than one component may be depicted throughout the figures and like components are labeled with like numerals. However, it is noted that specific elements may be denoted by a numeral and a subscript (e.g. 10a, 14b, etc.). When those elements are referred to generically, merely the numeral is used (e.g. 10, 14, etc.). The specific number of components depicted in the figures and the cross section orientation was chosen for illustrative purposes only.

Figure 1:
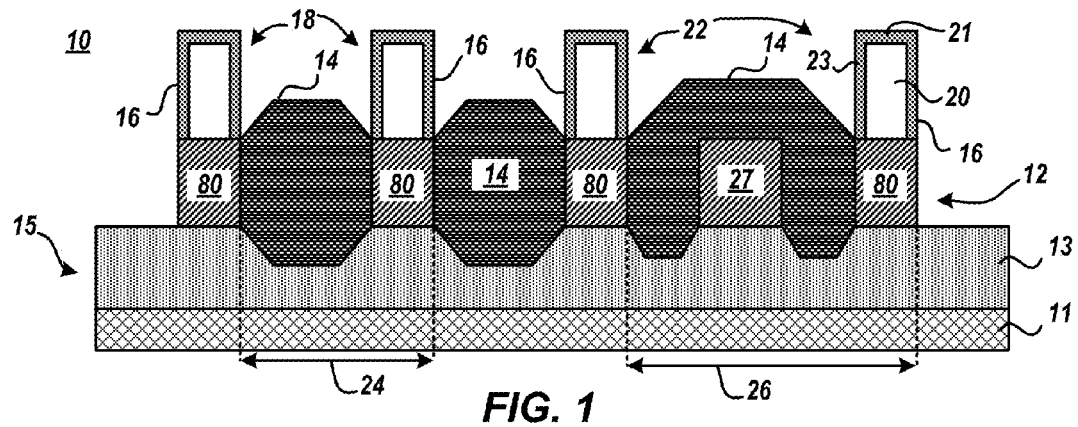
FIG. 1-FIG. 17 depict cross section views of a semiconductor structure at intermediate stages of semiconductor device fabrication, in accordance with various embodiments of the present invention.

FIG. 1 depicts a cross section view of semiconductor structure 10 at an intermediate stage of semiconductor device fabrication, in accordance with various embodiments of the present invention. Semiconductor structure 10 includes a substrate 15 having a plurality of fins 12 formed thereupon. A plurality of gate stacks 16 are formed upon substrate 15 generally perpendicular to fins 12. Epitaxy 14 is formed upon the sidewalls of fins 12, according to various embodiments of the present invention further described herein.

Substrate 15 may be, for example, a layered substrate 15a or a bulk substrate 15b. Layered substrate 15a may be as Si/SiGe, a silicon-on-insulator (SOI), or a SiGe-on-insulator (SGOI). Bulk semiconductor substrate 15b materials may include undoped Si, n-doped Si, p-doped Si, single crystal Si, polycrystalline Si, amorphous Si, Ge, SiGe, SiC, SiGeC, GaAs, InAs, InP, etc. A plurality of fins 12 may be etched from the substrate 15.

When layered substrate 15a is utilized, it may include a base substrate 11, a dielectric layer 13a formed on top of the base substrate, and a SOI layer formed on top of the buried dielectric layer. The buried dielectric layer 13a may isolate the SOI layer from the base substrate. The plurality of fins 12 may be etched from the SOI layer. The base substrate 11 may be made from any of several known semiconductor materials such as, for example, silicon, germanium, silicon-germanium alloy, silicon carbide, silicon-germanium carbide alloy, or other similar semiconductor materials. Non-limiting examples of compound semiconductor materials include gallium arsenide, indium arsenide, and indium phosphide. Typically the base substrate 11 may be about, but is not limited to, several hundred microns thick. For example, the base substrate may have a thickness ranging from 0.5 mm to about 1.5 mm.

The buried dielectric layer 13a may include any of several dielectric materials, for example, oxides, nitrides and oxynitrides of silicon. The buried dielectric layer 13a may also include oxides, nitrides and oxynitrides of elements other than silicon. In addition, the buried dielectric layer 13a may include crystalline or non-crystalline dielectric material. Moreover, the buried dielectric layer 13a may be formed using any of several known methods, for example, thermal or plasma oxidation or nitridation methods, chemical vapor deposition methods, and physical vapor deposition methods. The buried dielectric layer 13a may have a thickness ranging from about 5 nm to about 200 nm. In one embodiment, the buried dielectric layer may have a thickness ranging from about 150 nm to about 180 nm.

The SOI layer may include any of the several semiconductor materials included in the base substrate. In general, the base substrate and the SOI layer may include either identical or different semiconducting materials with respect to chemical composition, dopant concentration and crystallographic orientation. The base substrate 11a and the SOI layer include semiconducting materials that include at least different crystallographic orientations. Typically, the SOI layer may include a thickness ranging from about 5 nm to about 100 nm. In one embodiment, the SOI layer may have a thickness ranging from about 25 nm to about 30 nm. Methods for forming the SOI layer are well known in the art. Non-limiting examples include SIMOX (Separation by Implantation of Oxygen), wafer bonding, and ELTRAN® (Epitaxial Layer TRANsfer). It may be understood by a person having ordinary skill in the art that the plurality of fins 12 may be etched from the SOI layer. Because the plurality of fins 12 may be etched from the SOI layer, they too may include any of the characteristics listed above for the SOI layer.

When a bulk substrate 15b is utilized, the base substrate 11b may be etched to form fins 12. Dielectric portions 13b may then be formed between fins 12 and may include any of several dielectric materials, for example, oxides, nitrides and oxynitrides of silicon. The dielectric portions 13b may also include oxides, nitrides and oxynitrides of elements other than silicon. In addition, the dielectric portions 13b may include crystalline or non-crystalline dielectric material. Moreover, the dielectric portions 13b may be formed using any of several known methods, for example, chemical vapor deposition methods, and physical vapor deposition methods. The dielectric portions 13b may have a thickness ranging from about 5 nm to about 200 nm. In one embodiment, the dielectric portions 13b may have a thickness ranging from about 5 nm to about 50 nm, with 10 nm to 25 nm preferred. In certain embodiments, dielectric portions 13b may be etched or recessed following their formation.

Semiconductor structure 10 may also include a plurality of gate stacks 16. Gate stack 16 may include, for example, a gate 20, a gate cap 21, and a spacer 23, etc. Generally, gate stack 16 may be formed by using widely known techniques. For example, gate stack 16 may be formed by first providing a gate dielectric layer atop structure 10 (i.e. upon substrate 15 and fins 12) utilizing a conventional deposition process including, for example, chemical vapor deposition, plasma enhanced chemical vapor deposition or chemical solution deposition. Gate 20 may be formed upon the gate dielectric and a gate cap 21 formed atop gate 20 and spacers 23 on sides of gate 20. Generally, gate stack 16 may be formed by other known processes without deviating from the spirit of those embodiments herein claimed.

Semiconductor structure 10 may also include epitaxy 14, the formation of which is further described herein. Generally, epitaxial growth, grown, deposition, formation, etc. means the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a <100> crystal surface will take on a <100> orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses that are suitable for use in forming epitaxial semiconductor material of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the carbon doped epitaxial semiconductor material typically ranges from 550° C. to 900° C. Although higher temperature typically results in faster deposition, the faster deposition may result in crystal defects, film cracking, etc.

According to various embodiments of the present invention, semiconductor structure 10 may also include one or more dummy fins 27 formed between a first gate stack 16 pair 22 separated by a pitch 26 that is greater than a pitch 24 that separates a second gate stack 16 pair 18. When layered substrate 15a is utilized, dummy fin 27 may be etched from the SOI layer and therefore may include any of the SOI layer characteristics listed above. When bulk substrate 15b is utilized, the base substrate 11 may be etched to form dummy fin 27 and therefore may include any of the base substrate 11 characteristics listed above. As opposed to fins 12 that may serve as an active FinFET device (e.g. channel region, source region, drain region, etc.), dummy fin 27 serves as a filler to ensure epitaxy 14 merges during epitaxial formation.

Pitch 24 may have a width that ranges from e.g. 30 nm to 300 nm, although lesser and greater thickness have also been contemplated herein. For example, pitch 24 may be 64 nm. Generally, pitch 26 is wider than pitch 24 and may have a width equal to an integer multiplied by the width of pitch 24. For example, pitch 26 may have a width equal to 2×, 3×, 4×, 5× the width of pitch 24. For example, pitch 26 may be 128 nm, 320 nm, etc.

Generally, as FET (Field-Effect-Transistor) devices are being scaled down, the technology becomes more complex, and changes in device structures and new fabrication methods are needed to maintain the expected performance improvements from one successive device generation to the next. FinFET or Tri-Gate devices offer possible avenues to continue on the path of miniaturization.

There is difficulty in maintaining performance improvements in devices of deeply submicron generations. One general approach for improving performance is to try to increase carrier (electron and/or hole) mobilities. A promising avenue toward better carrier mobility is to apply tensile or compressive stress in the semiconductor channel regions. Typically, it may be preferable to have the channel of electron conduction type devices, such as NFET, in tensile stress, while to have the channel of hole conduction type devices, such as PFET, in compressive stress. In the case of the more common planar devices a method known in the art for stressing channels is the deposition of so called stress liners. Stress liners are insulating layers covering the devices, which layer are under stress, and then impart the stress onto the device channels. It is known that the stress distribution is such that if a stressing layer which covers a planar FET, is, for instance, in tensile stress, then the channel of the FET will also be under tensile stress, while the source and drain of the same device would be under compressive stress.

Applying stress to non-planar, three dimensional (3D) FETs, such as a FinFET, or Tri-Gate device, may be more difficult. Stress liners commonly used for planar devices are not very efficient, partly because of the 3D nature of the device, and partly because of the shrinking of the device pitch as technology progresses. Smaller device pitch leads to thinner stress liners, and that results in less channel stress. One way to increase the stress coupling to FinFET channel regions is to recess, namely etch down, the source/drain area of the fins 12 or epitaxially grow epitaxy 14 above and below the source/drain area of the fins 12.

Figure 2:
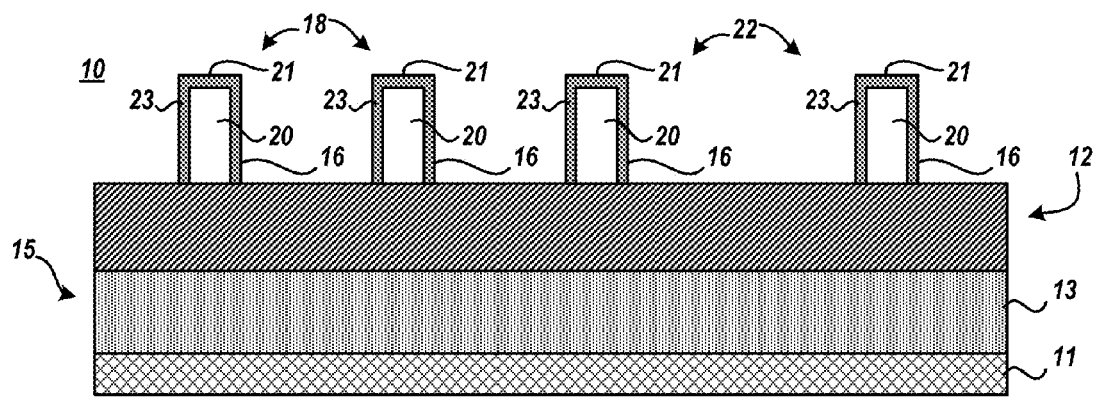

FIG. 2 depicts a cross section view of a semiconductor structure 10 at an intermediate stage of semiconductor device fabrication, in accordance with various embodiments of the present invention. At this stage of fabrication, fins 12 and gate stacks 16 are formed upon semiconductor structure 10. Note, though one fin 12 is shown in FIG. 2, additional fins 12, visible at various cross sections into or out of the page, may be formed on semiconductor structure 10. As shown in FIG. 2, layered substrate 15a may include the base substrate 11 and the buried dielectric layer 13a formed on top of the base substrate. A SOI layer (not shown) is formed on top of the buried dielectric layer 13a. The buried dielectric layer 13a may isolate the SOI layer from the base substrate. The plurality of fins 12 may be etched from the SOI layer. When a bulk substrate 15b is utilized, fins 12 may be etched from base substrate 11. Dielectric portions 13b may then be formed between fins 12. In certain embodiments, dielectric portions 13b may be etched or recessed following their formation. Generally, fins 12 may be formed upon a semiconductor structure 10 by other known processes or techniques without deviating from the spirit of those embodiments herein claimed.

Further at this stage of fabrication, gate stack 16 is formed upon semiconductor structure 10. In certain embodiments, a gate dielectric layer (not shown) may be formed atop semiconductor structure 10 (i.e. upon substrate 15 and fins 12) generally orthogonal to fins 12 utilizing a conventional deposition process including, for example, chemical vapor deposition, plasma enhanced chemical vapor deposition or chemical solution deposition. A layer of gate 20 material may be formed upon gate dielectric and a gate cap 21 may be formed upon gate 20. The layers may then patterned by lithography and etched to form a gate stack 16. In certain embodiments, spacers 23 may be formed on the sides of gate stack 16. Generally, gate stack 16 may be formed by other known processes without deviating from the spirit of those embodiments herein claimed.

Figure 3:
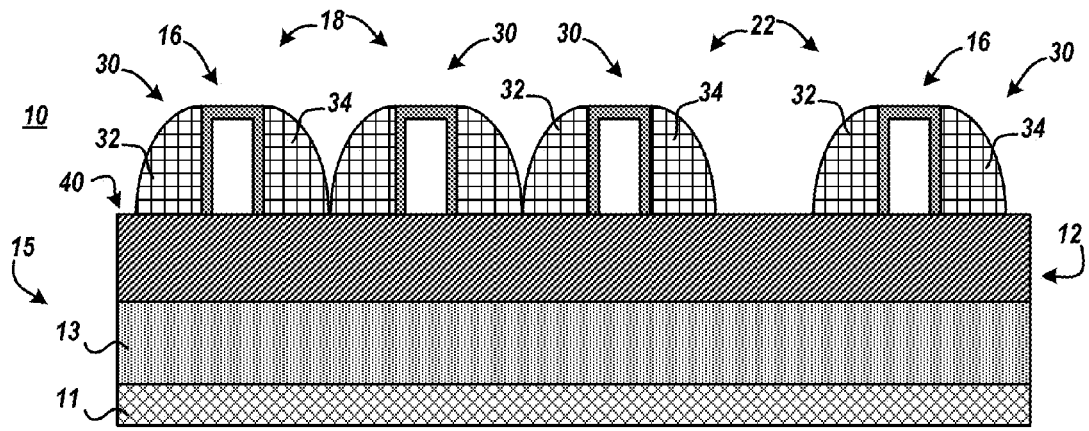

FIG. 3 depicts a cross section view of a semiconductor structure 10 at an intermediate stage of semiconductor device fabrication, in accordance with various embodiments of the present invention. At this stage of fabrication, sacrificial spacers 30 are formed upon gate stacks 16. Sacrificial spacers 30 include a first portion 32 formed upon a first sidewall of gate stack 16 and a second portion 34 formed upon an opposing sidewall of gate stack 16.

The first sacrificial spacer portion 32 and second sacrificial spacer portion 34 may be composed of a dielectric material, such as an oxide, nitride, oxynitride, silicon nitride, silicon oxide, silicon oxynitride, amorphous carbon, or any other suitable combination thereof. For example, portion 32 and portion 34 may be amorphous carbon. The first portion 32 and second portion 34 may be provided by forming processes, such as deposition or thermal growth. For example, the first portion 32 and second portion 34 may be formed by deposition processes, such as chemical vapor deposition (CVD). The first portion 32 and second portion 34 may each have a width that ranges from e.g. 1 nm to 60 nm, although lesser and greater thickness have also been contemplated herein. However, more generally, first portion 32 and second portion 34 may have a combined width sufficient to cover an upper surface 40 of fin 12 between pair 18. For example, the width of first portion 32 and the width of second portion may be equal to half the width separating gate stack 16 pair 18. For example, sacrificial spacer 30 portions 32 and 34 may be 16 nm thick if pitch 24 equals 64 nm to have a width sufficient to cover an upper surface 40 of fin 12 between pair 18 (i.e. if pitch 24 is 64 nm, gate 20 length is 20 nm, gate spacer 23 is 6 nm, then the opening between pair 18 is 32 nm (i.e. 64 nm minus 20 nm minus (2×6 nm)=32 nm). Thus, each spacer portion may be 16 nm thick. Sacrificial spacers 30 may be used to ensure a suitable amount of material protects the plurality of fins 12, protects active areas of structure 10, etc. from formation or removal techniques of subsequent stages of semiconductor device fabrication. Typically, sacrificial spacers 30 may include a single layer; however, sacrificial spacers 30 may include multiple layers of material. Generally, sacrificial spacers 30 may be formed by other known processes without deviating from the spirit of those embodiments herein claimed.

According to various embodiments of the present invention, the formation of sacrificial spacers 30 result in an open-area 45 where sacrificial spacers 30 do not cover upper surface 40 of fin 12 between gate stack 16 pair 22. The width of the open-area 45 may be the width of pitch 26 minus gate 20 length minus 2 times gate spacer 23 thickness minus 2 times the sacrificial spacer 30 portion thickness. For example, if pitch 24 is 64 nm, pitch 26 is 128 nm, gate 20 length is 20 nm, gate spacer 23 thickness is 6 nm, and sacrificial spacer 30 portion thickness is 16 nm, the width of open-area 45 may be 64 nm (i.e. 128 nm minus 20 nm minus (2×6 nm) minus (2×16 nm)).

Figure 4:
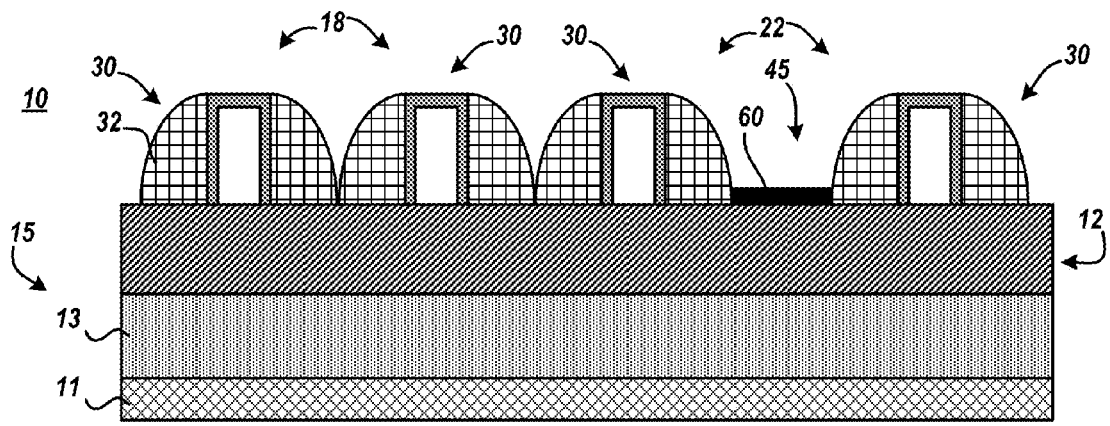

FIG. 4 depicts a cross section view of a semiconductor structure 10 at an intermediate stage of semiconductor device fabrication, in accordance with various embodiments of the present invention. At this stage of fabrication, mask 60 is formed within open-area 45 upon upper surface 40 of fin 12 between gate stack 16 pair 22. In certain embodiments, mask 60 may be a local protection layer used in subsequent stages of semiconductor device fabrication.

Mask 60 may be composed of a dielectric material, such as an oxide, nitride, oxynitride, silicon nitride, silicon oxide, silicon oxynitride, amorphous carbon, or any other suitable combination thereof. The materials of mask 60 may differ from the materials of sacrificial spacers 30 to allow for selective removal of sacrificial spacers 30 relative to mask 60. Therefore, for example, mask 60 may be oxide. Mask 60 may be provided by forming processes, such as deposition or thermal growth. For example, mask 60 may be formed by deposition processes, such as CVD. Mask 60 may have a height that ranges from e.g. 2 nm to 25 nm, although lesser and greater thickness have also been contemplated herein. For example, mask may have a height of 5 nm. Generally, mask 60 may be formed by other known processes without deviating from the spirit of those embodiments herein claimed.

Figure 5:
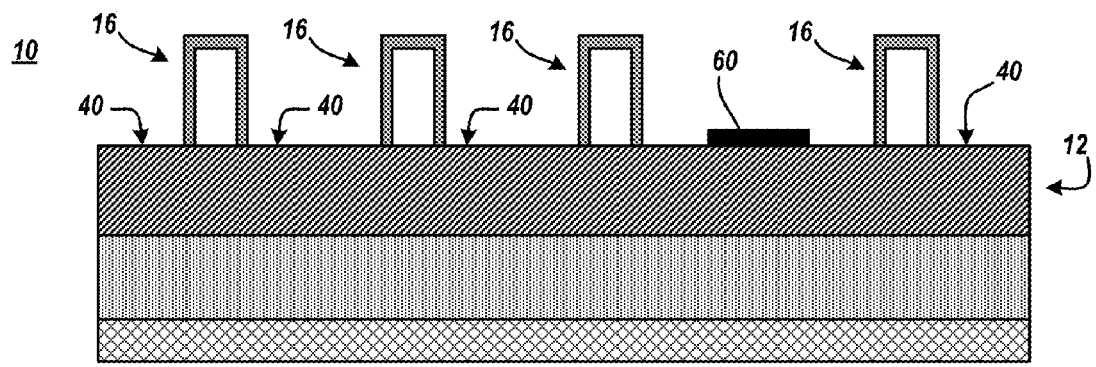

FIG. 5 depicts a cross section view of a semiconductor structure 10 at an intermediate stage of semiconductor device fabrication, in accordance with various embodiments of the present invention. At this stage of fabrication, sacrificial spacers 30 are selectively removed to expose gate stack 16 sidewalls, upper surface 40 of fin 12, mask 60, etc.

The sacrificial spacers 30 may be removed using any suitable etching technique such as dry etch, wet etch, or combination of both to selectively remove sacrificial spacers 30 to expose gate stack 16 sidewalls, upper surface 40 of fin 12, mask 60, etc. For example, the sacrificial spacers 30 can be removed using dry plasma oxygen ash process followed by a wet cleaning process. In certain implementations, the etching technique may require a etch mask to be formed that resists etching to protect portions of semiconductor device 10. Following the formation of the etch mask, the sacrificial spacers 30 may then removed by an etch process having high selectivity to removing the material of the sacrificial spacers 30 portion 32 and portion 34 without substantially etching the etch mask, gate stack 16, fin 12, mask 60, etc. Following the removal of sacrificial spacers 30, the etch mask may be removed. In certain embodiments, the etching techniques to remove sacrificial spacers 30 may also remove a portion of mask 60 (e.g. mask 60 overgrowth, etc.). Generally, sacrificial spacers 30 may be removed by other known processes without deviating from the spirit of those embodiments herein claimed.

Figure 6:
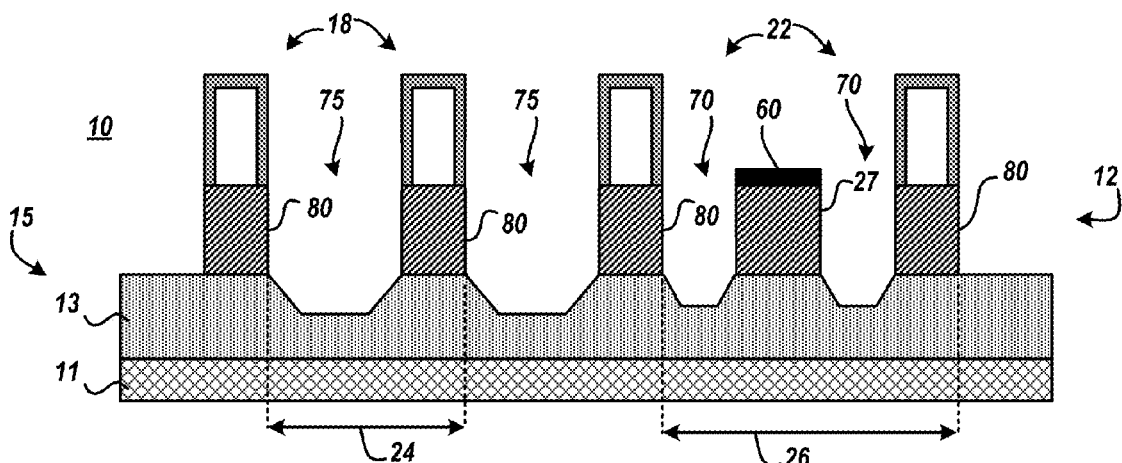

FIG. 6 depicts a cross section view of a semiconductor structure 10 at an intermediate stage of semiconductor device fabrication, in accordance with various embodiments of the present invention. At this stage of fabrication, recess regions 70 and recess regions 75 are formed. In certain embodiments, recess regions 70 and recess regions 75 may be formed by removing portions of fins 12.

The portions of fins 12 may be removed using any suitable etching technique such as dry etch, wet etch, or combination of both. The etching technique may require a etch mask to be formed upon and to protect portions of semiconductor device 10. For example, the portions of fins 12 may be removed by known patterning and etching procedures of the VLSI arts, such as, for instance, reactive ion etching (RIE). A first etch process may remove portions of fins 12 and may penetrate to an upper surface of substrate 13 and a second etch process may remove portions of substrate 13. However, in certain embodiments, a single etch process may both remove portions of fins 12 and may remove portions of substrate 13. At this stage of fabrication, the originally continuous fins 12 have been cut into fin segments 80 and dummy fins 27 with each of the gate stacks 16 being associated with one of the fin segments 80. According to various embodiments, recess regions 70 separate a fin segment 80 and dummy fin 27 and recess regions 75 separate one fin segment 80 from another fin segment 80.

The patterning and etching procedures are used to obtain a depth and side profile of recess regions 70 and recess regions 75 according to design purposes and to retain one or more crystalline surface(s) for subsequent epitaxy 14 formation. For instance, recess regions 70 and recess regions 75 can be formed by a directional dry etch which can form substantially straight sidewalls or by a wet (or other isotropic) etch process which can form undercuts, etc. In an embodiment of the disclosure, following the etching, gate stack 16 sidewall and possibly other layers around the gate stack 16, may be re-formed, or re-fabricated. Generally, recess regions 70 and recess regions 75 may be removed by other known processes without deviating from the spirit of those embodiments herein claimed.

In certain embodiments, the recessing of fins 12 is a uniform recess because of the depth of the recess regions 70 and recess regions 75 and because of relatively less size distribution of recess regions 70 and recess regions 75.

Figure 7:
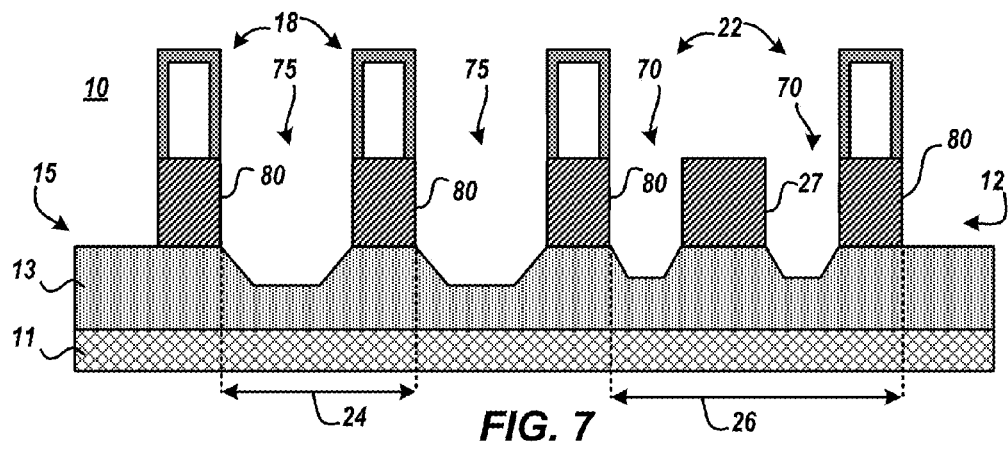

FIG. 7 depicts a cross section view of a semiconductor structure 10 at an intermediate stage of semiconductor device fabrication, in accordance with various embodiments of the present invention. At this stage of fabrication, mask 60 is removed from dummy fin 27. Mask 60 may be removed using any suitable etching technique such as dry etch, wet etch, or combination of both, etc. In certain embodiments, mask 60 may be stripped during epitaxy 14 pre-clean processes. Generally, mask 60 may be removed by other known processes without deviating from the spirit of those embodiments herein claimed.

Figure 8:
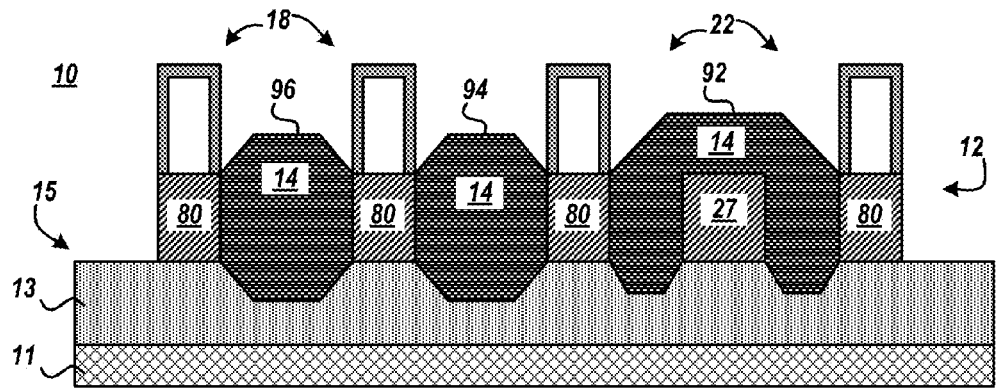

FIG. 8 depicts a cross section view of a semiconductor structure 10 at an intermediate stage of semiconductor device fabrication, in accordance with various embodiments of the present invention. At this stage of fabrication, epitaxy 14 is formed to merge fin segments 80, dummy fin 27, etc. A non limiting list of exemplary expitaxial materials are: silicon germanium alloy (SiGe), Silicon (Si), in-situ boron doped SiGe or Si, in situ phosphorus or arsenic doped Si or SiGe, with doping levels ranging from 1e19 to 1.5e21, with 4-9e20 dopant levels preferred.

Generally, epitaxy 14 is epitaxially grown upon fin segment 80 and dummy fin 27 sidewalls. In various embodiments, substrate 13 has a <100> orientation and fin segment 80 and dummy fin 27 sidewalls have a <110> orientation. Epitaxy is grown off the fin segment 80 and dummy fin 27 sidewalls and a diamond structure is initially grown. The outer diamond structure will have a <111> plane. Epitaxy growth is quickest from <100> planes and is slowest from <111> planes. When epitaxy growth from the fin segment 80 and dummy fin 27 sidewalls is complete, <111> bound diamond shaped structures may merge. For example, the tips of neighboring the pre-merge diamond shaped epitaxy may meet and a <100> plane is formed there between allowing for further epitaxial growth from the <100> plane. This further growth fills recess regions 70 and recess regions 75 thereby merging fin segments 80, dummy fin 27, etc.

As opposed to fin segments 80 that may serve as an active FinFET device (e.g. channel region, source region, drain region, etc.), dummy fin 27 serves as a filler to ensure epitaxy 14 merges (e.g. epitaxy 14 merges fin segments 80 associated with gate stack 16 pair 22, etc.) during epitaxial formation. In other words, dummy fin 27 serves as a filler, partial filler, etc. and adds additional epitaxial growth planes within pitch 26 for the merging of fin segments 80 associated with gate stack 16 pair 22 by epitaxy 14.

The material of the fins 12 may itself serve as the seed surface for the epitaxial growth of the material of epitaxy 14. The epitaxy 14 growth may be carried out in a selective manner, meaning that the epitaxial growth occurs only over certain surfaces, for instance over the fin segments 80, dummy fin 27, while other surfaces stay essentially free of the epitaxy material. Selective epitaxial growth has known techniques in the art. In certain embodiments, possible surplus epitaxial material may be removed, for instance from the upper surfaces of the fin segments 80 associated with gate stack 16 pair 18. Such removal may take the form of various dry or wet etchings, including timed and selective etchings, or removal by polishing, as these are all known techniques in the art.

In representative embodiments of the invention the epitaxy 14 material may have resulted from epitaxial growth on the side surfaces of fin segments 80 and dummy fin 27. A hard mask (not shown) on those upper surfaces may facilitate the selective growth on the sidewalls. The epitaxial growth may be stopped once the epitaxy material growing on the sidewalls fills up recess regions 70 and recess regions 75. Once the fin segments 80 and dummy fin 27 are merged, a continuous material has been formed with the material of fin 12 alternating with the epitaxial grown material of epitaxy 14.

In certain embodiments, it may be desirable to achieve low resistivity electrical connections between fin segments 80, dummy fin 27, etc. Consequently, one may dope the epitaxy 14 material to the same type of conductivity as the fin 12 material. Such doping may be performed during the epitaxial growth, in so called in-situ doping schemes, as known in the art. Both p-type and n-type dopants are well known in the art, and any of them may be used in the embodiments of the present disclosure for doping both the fin 12 material and the epitaxy 14 material.

A further consideration in selecting the fin 12 material and the epitaxy 14 material may involves the state of stress in each. If the epitaxy 14 material has a larger lattice constant than the fin 12 material, the epitaxy 14 applies a compressive stress onto the channel region. It is well known that the lattice constant of Si:C is smaller than that of Si, approximately in proportion with the carbon content. It is also known that the lattice constant of SiGe is larger than that of Si, approximately in proportion with the germanium content. Consequently, the selection of the epitaxy 14 material may also depend on the desired stress state in the channels of the FinFET devices Consequently, for NFET devices, where the channel carriers are electrons and tensile stress is advantageous in the channel, one may select the fin 12 material to be essentially Si or a SiGe alloy, and the epitaxy 14 material to be Si:C with between 1% and 5% C concentration, or SiGe alloy with lesser Ge contration than channel material. With such a selection the second material may impart a tensile stress onto the fins, resulting in a tensile stress in the FinFET device channel. For PFET devices, where the channel carriers are holes and compressive stress is advantageous in the channel, one may select the fin 12 material to be essentially Si or a SiGe alloy mixture, and the epitaxy 14 material to be SiGe alloy a higher Ge concentration than the channel material. With such a selection the epitaxy 14 material may impart a compressive stress onto the fins 12, resulting in a compressive stress in the FinFET device channel. In further embodiments of the invention it may occur that the stress, which would arise from lattice constant differences between the fin 12 material and the epitaxy 14 material, becomes relaxed due to lattice defects, such as dislocations.

In certain embodiments, upper surface 92 of epitaxy 14 between pair 22 is above the upper surface 94 and upper surface 96 of epitaxy 14. In certain embodiments, upper surface 94 and upper surface 96 are coplanar. In certain embodiments, the upper surface of dummy fin 27 is coplanar with the upper surface of fin segments 80.

Figure 9:
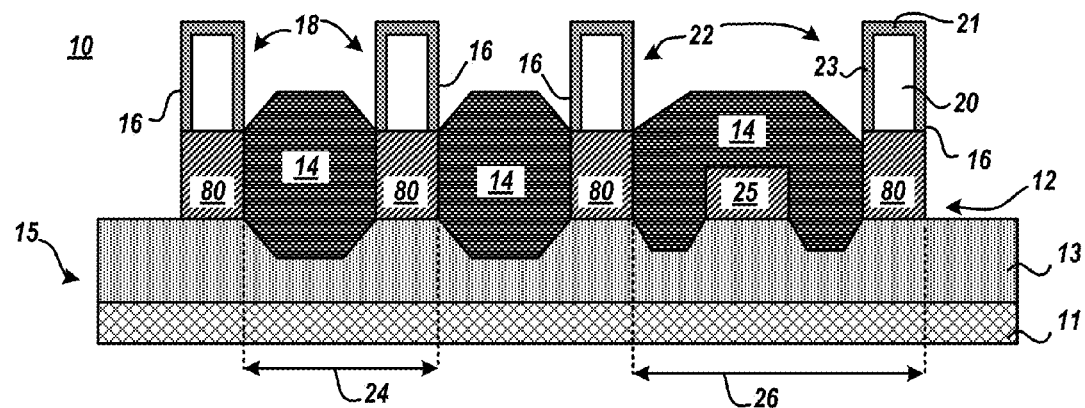

FIG. 9 depicts a cross section view of another embodiment of semiconductor structure 10 at an intermediate stage of semiconductor device fabrication. Semiconductor structure 10 includes a substrate 15 having a plurality of fins 12 formed thereupon. A plurality of gate stacks 16 are formed upon substrate 15 generally perpendicular to fins 12. Epitaxy 14 is formed upon the sidewalls of fins 12, according to various embodiments of the present invention further described herein. In the present embodiment illustrated, semiconductor structure 10 includes a recessed dummy fin 25 and partially recessed fins 12.

According to various embodiments of the present invention, semiconductor structure 10 may also include one or more recessed dummy fins 25 formed between gate stack 16 pair 22 separated by pitch 26. When layered substrate 15*a* is utilized, recessed dummy fin 25 may be etched from the SOI layer and therefore may include any of the SOI layer characteristics listed above. When bulk substrate 15*b* is utilized, the base substrate 11 may be etched to form recessed dummy fin 25 and therefore may include any of the base substrate 11 characteristics listed above. Recessed dummy fin 25 may be recessed where a portion of the dummy fin material is removed prior to forming epitaxy 14. Therefore an upper surface of dummy fin 25 may be below the upper surface of fin portions 80. In various embodiments, recessed dummy fin 25 serves as a filler to ensure epitaxy 14 merges during epitaxial formation. Further, the upper surfaces of epitaxy 14 regions may be coplanar.

Figure 10:
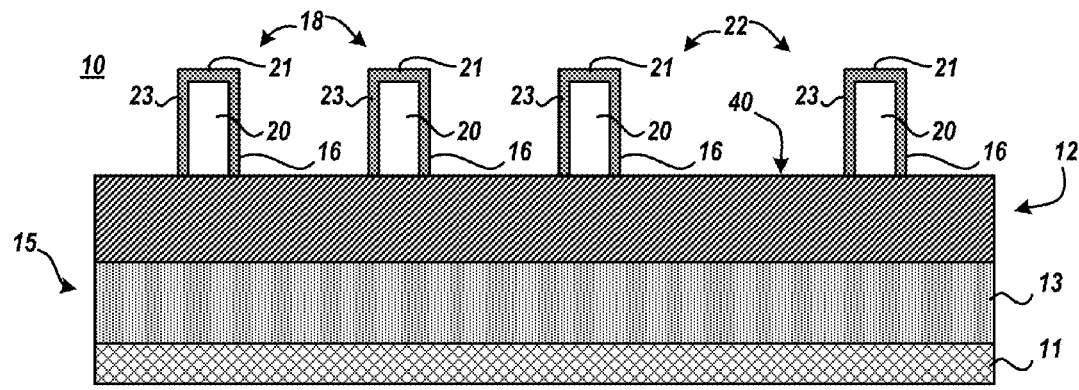

FIG. 10 depicts a cross section view of a semiconductor structure 10 at an intermediate stage of semiconductor device fabrication, in accordance with various embodiments of the present invention. At this stage of fabrication, fins 12 and gate stacks 16 are formed upon semiconductor structure 10. For clarity, FIG. 10 is a reproduction of FIG. 2 and is included for convenience.

Figure 11:
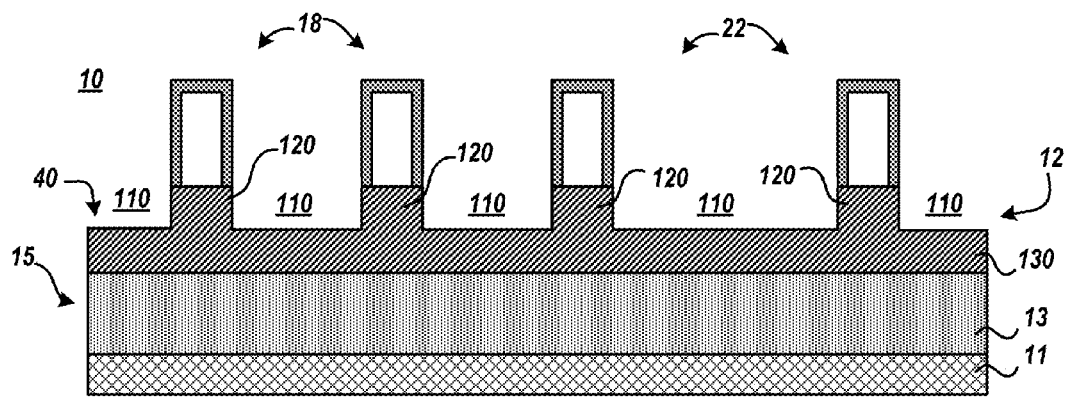

FIG. 11 depicts a cross section view of a semiconductor structure 10 at an intermediate stage of semiconductor device fabrication, in accordance with various embodiments of the present invention. At this stage of fabrication, fins 12 are partially recessed.

Portions 110 of fins 12 may be removed using any suitable etching technique such as dry etch, wet etch, or combination of both. The etching technique may require a etch mask to be formed upon and to protect portions of semiconductor device 10. For example, the portions 110 of fins 12 may be removed by known patterning and etching procedures of the VLSI arts. As shown, the material of fins 12 is recessed in a vertically offset position relative to upper surface 40 thereby leaving fin portions 120 vertically extending from fin base 130. In an embodiment of the disclosure, following the selective etching, the gate stack 16 sidewall and possibly other layers around the gate stack 16, may be re-formed, or re-fabricated.

Portions 110 recessed from fins 12 may have a depth that ranges from e.g. 25 nm to 200 nm, although lesser and greater thickness have also been contemplated herein. For example, portions 110 may have a depth of 50 nm.

Figure 12:
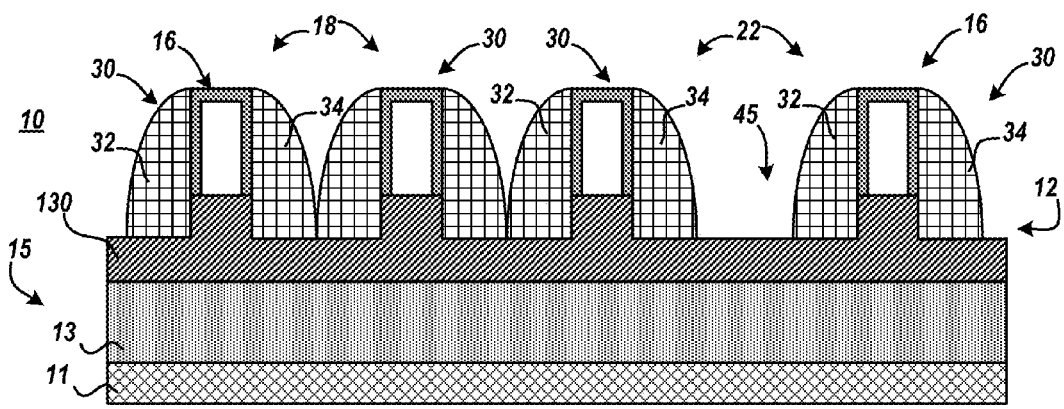

FIG. 12 depicts a cross section view of a semiconductor structure 10 at an intermediate stage of semiconductor device fabrication, in accordance with various embodiments of the present invention. At this stage of fabrication, sacrificial spacers 30 are formed upon gate stacks 16 and fin portions 120. The first portion 32 may be formed upon a first sidewall of gate stack 16 and a first fin portion 120 sidewall. The second portion 34 formed upon the opposing sidewall of gate stack 16 and the opposing sidewall of fin portion 120.

The first portion 32 and second portion 34 may have a combined width sufficient to cover an upper surface of fin base 120 between gate stack 16 pair 18. For example, the width of first portion 32 and the width of second portion may be equal to half the width separating gate stack 16 pair 18. Sacrificial spacers 30 may be used to ensure a suitable amount of material protects the plurality of fin portions 120, gate stack 16 sidewalls, protects active areas of structure 10, etc. from formation or removal techniques of subsequent stages of semiconductor device fabrication. According to various embodiments of the present invention, the formation of sacrificial spacers 30 result in a open-area 45 where sacrificial spacers 30 do not cover the upper surface of fin base 130 between gate stack 16 pair 22.

Figure 13:
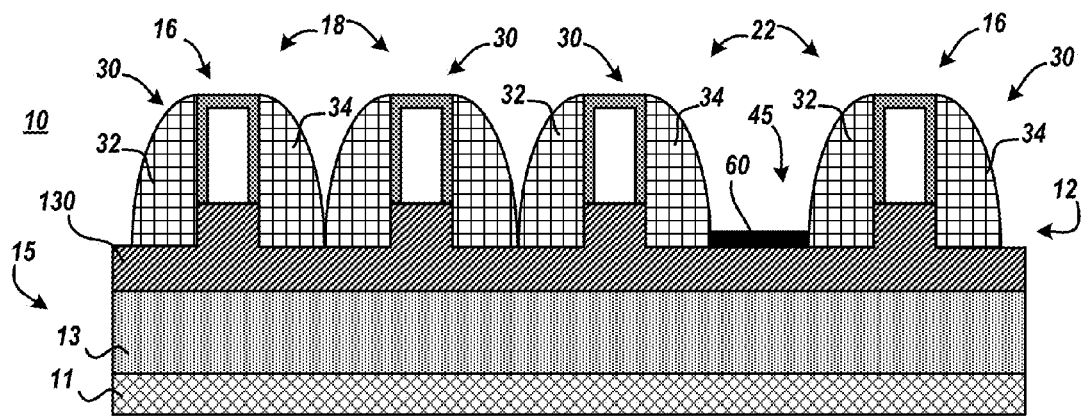

FIG. 13 depicts a cross section view of a semiconductor structure 10 at an intermediate stage of semiconductor device fabrication, in accordance with various embodiments of the present invention. At this stage of fabrication, mask 60 is formed within open-area 45 upon upper surface of fin base 130 between gate stack 16 pair 22.

Figure 14:
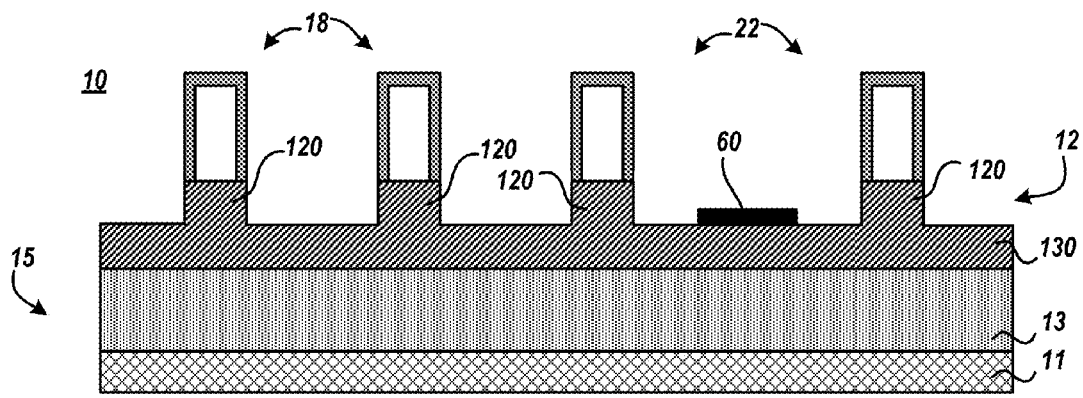

FIG. 14 depicts a cross section view of a semiconductor structure 10 at an intermediate stage of semiconductor device fabrication, in accordance with various embodiments of the present invention. At this stage of fabrication, sacrificial spacers 30 are selectively removed to expose gate stack 16 sidewalls, fin portion 120 sidewalls, upper surface fin base 130, mask 60, etc. The sacrificial spacers 30 may be removed using any suitable etching technique such as dry etch, wet etch, or combination of both to selectively remove sacrificial spacers 30 to expose gate stack 16 sidewalls, fin portion 120 sidewalls, upper surface fin base 130, mask 60, etc. The sacrificial spacers 30 may be removed by an etch process having high selectivity to removing the material of the sacrificial spacers 30 portion 32 and portion 34 without substantially etching an etch mask, gate stack 16, fin 12 material, mask 60, etc.

Figure 15:
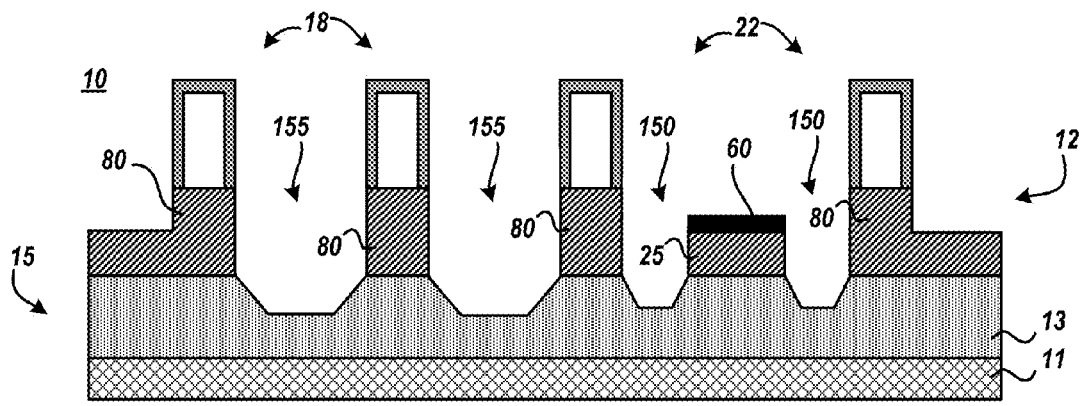

FIG. 15 depicts a cross section view of a semiconductor structure 10 at an intermediate stage of semiconductor device fabrication, in accordance with various embodiments of the present invention. At this stage of fabrication, recess regions 150 and recess regions 155 are formed. In certain embodiments, recess regions 150 and recess regions 155 may be formed by removing portions of fins 12. According to various embodiments, recess regions 150 separate a fin segment 80 and recessed dummy fin 25 and recess regions 155 separate one fin segment 80 from another fin segment 80. At this stage of fabrication, the fin portions 120 and fin base 130 have been cut into fin segments 80 and recessed dummy fins 25. In certain embodiments, each of the gate stacks 16 is associated with one of the fin segments 80.

The patterning and etching procedures are used to obtain a depth and side profile of recess regions 150 and recess regions 155 according to design purposes and to retain one or more crystalline surface(s) for subsequent epitaxy 14 formation. For instance, recess regions 150 and recess regions 155 can be formed by a directional dry etch which can form substantially straight sidewalls or by a wet (or other isotropic) etch process which can form undercuts, etc. In an embodiment of the disclosure, following the etching, gate stack 16 sidewall and possibly other layers around the gate stack 16, may be re-formed, or re-fabricated. Generally, recess regions 150 and recess regions 155 may be removed by other known processes without deviating from the spirit of those embodiments herein claimed.

In certain embodiments, the recessing of fins 12 is a uniform recess because of the depth of the recess regions 150 and recess regions 155 and because of relatively less size distribution of recess regions 150 and recess regions 150.

Figure 16:
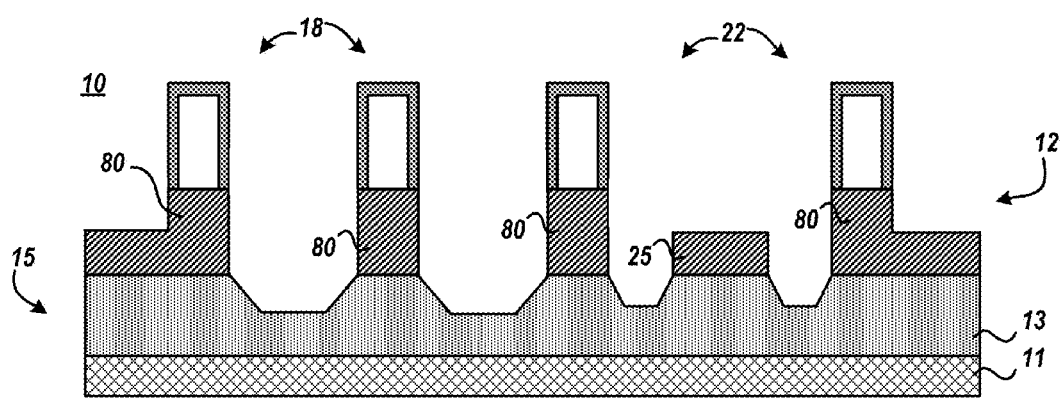

FIG. 16 depicts a cross section view of a semiconductor structure 10 at an intermediate stage of semiconductor device fabrication, in accordance with various embodiments of the present invention. At this stage of fabrication, mask 60 is removed from recessed dummy fin 25.

Figure 17:
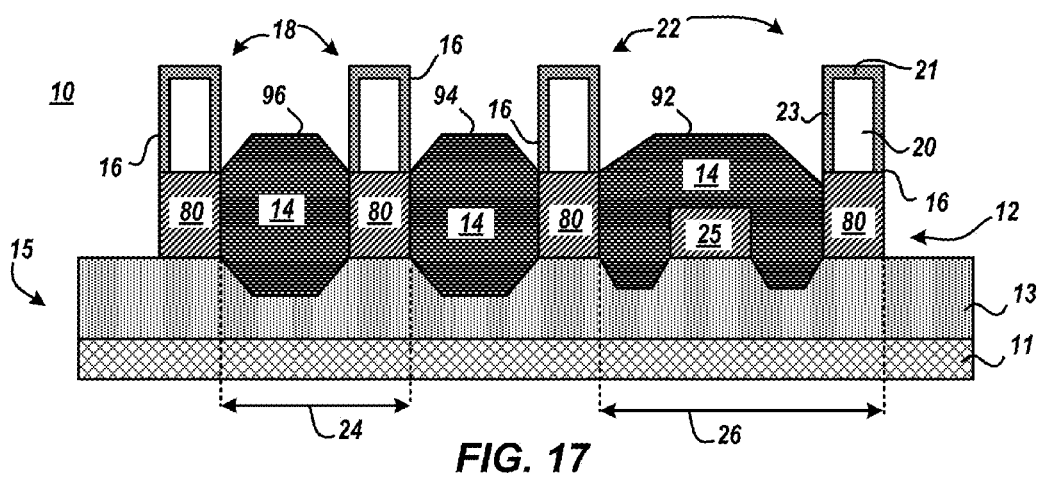

FIG. 17 depicts a cross section view of a semiconductor structure 10 at an intermediate stage of semiconductor device fabrication, in accordance with various embodiments of the present invention. At this stage of fabrication, epitaxy 14 is formed to merge fin segments 80, recessed dummy fin 25, etc.

Generally, epitaxy 14 is epitaxially grown upon fin segment 80 and recessed dummy fin 25 sidewalls. In various embodiments, substrate 13 has a <100> orientation and fin segment 80 and recessed dummy fin 25 sidewalls have a <110> orientation. Epitaxy is grown off the fin segment 80 and recessed dummy fin 25 sidewalls and a diamond structure is initially grown. The outer diamond structure will have a <111> plane. When epitaxy growth from the fin segment 80 and recessed dummy fin 25 sidewalls is complete, <111> bound diamond shaped structures may merge. This further growth fills recess regions 150 and recess regions 155 thereby merging fin segments 80, recessed dummy fin 27, etc.

As opposed to fin segments 80 that may serve as an active FinFET device (e.g. channel region, source region, drain region, etc.), recessed dummy fin 25 serves as a filler to ensure epitaxy 14 merges (e.g. epitaxy 14 merges fin segments 80 associated with gate stack 16 pair 22, etc.) during epitaxial formation. In other words, recessed dummy fin 25 serves as a filler, partial filler, etc. and adds additional epitaxial growth planes within pitch 26 for the merging of fin segments 80 associated with gate stack 16 pair 22 by epitaxy 14.

The epitaxy 14 growth may be carried out in a selective manner, meaning that the epitaxial growth occurs only over certain surfaces, for instance over the fin segments 80, recessed dummy fin 27, while other surfaces stay essentially free of the epitaxy material.

In representative embodiments of the invention the epitaxy 14 material may have resulted from epitaxial growth on the side surfaces of fin segments 80 and recessed dummy fin 25. A hard mask (not shown) on those upper surfaces may facilitate the selective growth on the sidewalls. The epitaxial growth may be stopped once the epitaxy material growing on the sidewalls fills up recess regions 150 and recess regions 155. Once the fin segments 80 and recessed dummy fin 25 are merged, a continuous material has been formed with the material of fin 12 alternating with the epitaxial grown material of epitaxy 14. In certain embodiments, it may be desirable to achieve low resistivity electrical connections between fin segments 80, recessed dummy fin 25, etc.

In certain embodiments, upper surface 92 of epitaxy 14 associated with pitch 26 is coplanar with upper surface 94 and upper surface 96 of epitaxy 14 associated with pitch 24. In certain embodiments, the upper surface of recessed dummy fin 25 is below the upper surfaces of fin segments 80. In various embodiments, recessed dummy fin 25 may be utilized to lessen epitaxy 14 overgrowth within pitch 26.

Figure 18:
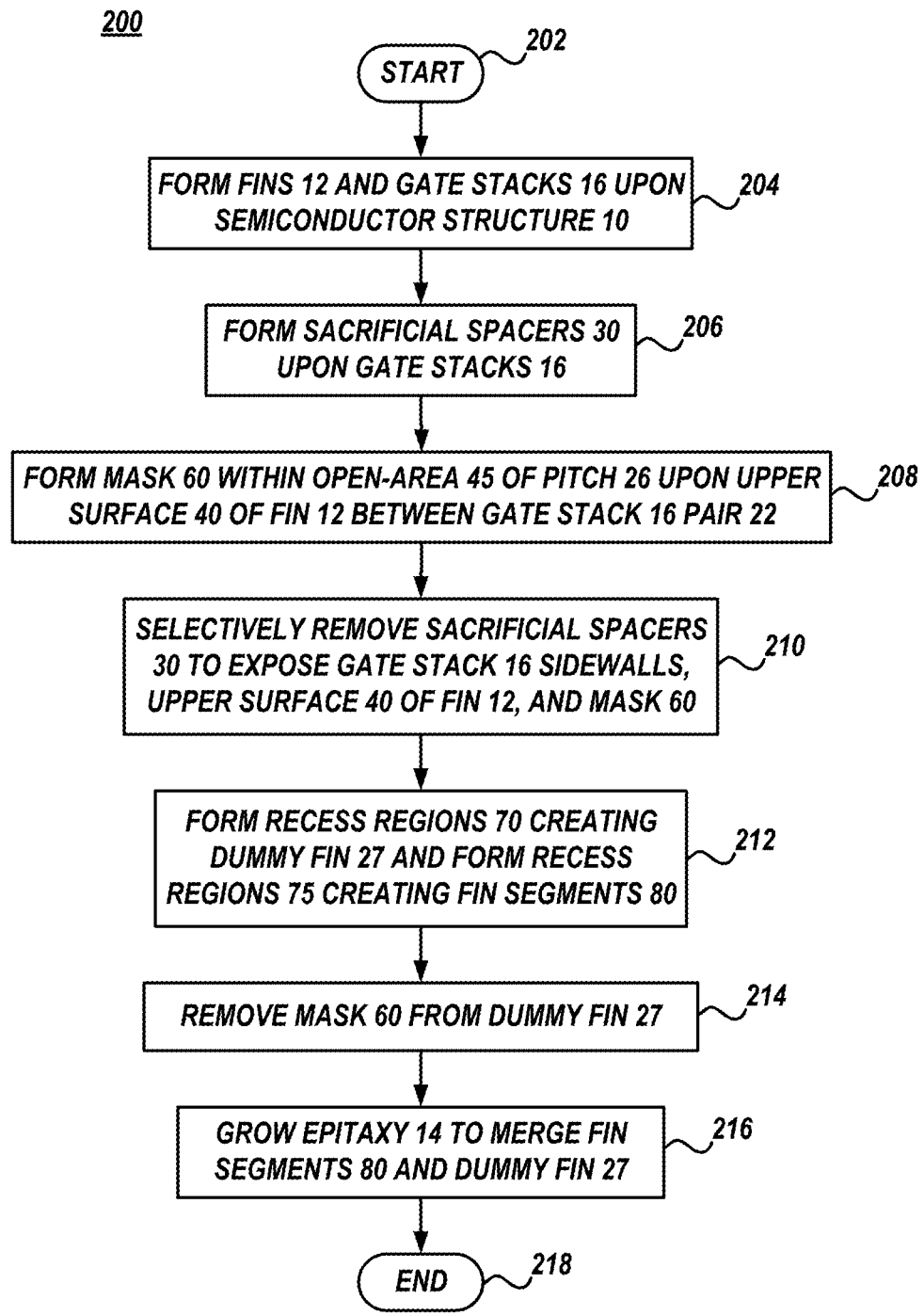
FIG. 18 and FIG. 19 depict exemplary fabrication process flow methods, in accordance with various embodiments of the present invention.

FIG. 18 depicts an exemplary process flow method 200 for manufacturing a semiconductor device, in accordance with various embodiments of the present invention. Method 200 begins at block 202 and continues by forming fins 12 and forming gates upon e.g. substrate 15 of semiconductor structure 10 (block 204). In certain embodiments, a gate 20 (gate stack 16, etc.) is formed upon the substrate (block 204). The gate 20 may be formed generally orthogonal to fins 12.

Method 200 continues with forming sacrificial spacers 30 upon gates 20, gate stacks 16, etc. (block 206). In certain embodiments, a first portion 32 of sacrificial spacer 30 is formed upon a first sidewall of gate stack 16 and a second portion 34 of sacrificial spacer 30 formed upon an opposing sidewall of gate stack 16. Mask 60 is formed within open-area 45 upon upper surface 40 of fin 12 between gate stack 16 pair 22 (block 208). In certain embodiments, mask 60 may be a local protection layer used in subsequent stages of semiconductor device fabrication. In certain embodiments, mask 60 is formed between respective sacrificial spacers 30 portions associated with pair 22 within pitch 26.

Method 200 continues with selectively removing sacrificial spacers 30 to expose gate stacks 16, upper surface 40 of fin(s) 12, and mask 60 (block 210). In certain embodiments, first portion 32 of sacrificial spacer 30 and second portion 34 of sacrificial spacer 30 are selectively removed from gate stack 16 sidewalls, upper surface 40 of fin(s) 12, and mask 60. Method 200 continues with forming recess regions 70 and recess regions 75 (block 212). In certain embodiments, recess regions 70 and recess regions 75 may be formed by removing portions of fins 12 to create dummy fin 27 and fin segments 80. Method 200 continues with removing mask 60 from dummy fin 27 (block 214). In certain embodiments, dummy fin 27 serves as a filler, partial filler, etc. and adds additional epitaxial growth planes within pitch 26 for the epitaxial merging of neighboring fin segments 80.

Method 200 continues with growing epitaxy 14 to merge fin segments 80 and dummy fin 27 (block 216). In certain embodiments, epitaxy 14 is epitaxially grown upon fin segment 80 and dummy fin 27 sidewalls and fills recess regions 70 and recess regions 75 thereby merging fin segments 80, dummy fin 27, etc. Method 200 ends at block 218.

Figure 19:
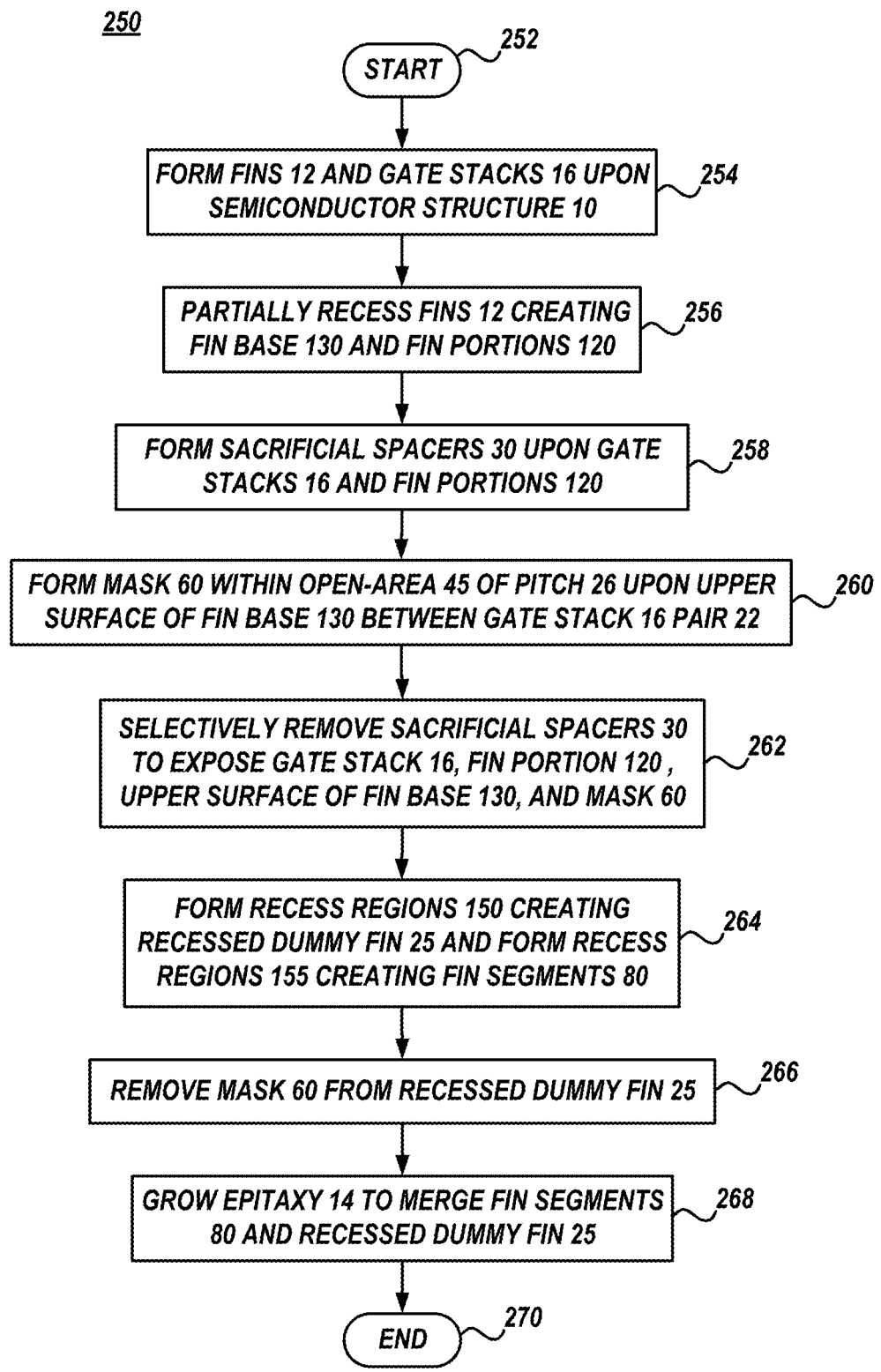

FIG. 19 depicts an exemplary process flow method 250 for manufacturing a semiconductor device, in accordance with various embodiments of the present invention. Method 250 begins at block 252 and continues by forming fins 12 and forming gates upon e.g. substrate 15 of semiconductor structure 10 (block 254). In certain embodiments, a gate 20 (gate stack 16, etc.) is formed upon the substrate (block 254). The gate 20 may be formed generally orthogonal to fins 12.

Method 250 continues with partially recessing a fin 12 creating a fin base 130 and fin portions 120 (block 256). In certain embodiments, portions 110 of fins 12 may be removed using any suitable etching technique such as dry etch, wet etch, or combination of both. The material of fins 12 may be recessed in a vertically offset position relative to upper surface 40 thereby leaving fin portions 120 vertically extending from fin base 130.

Method 250 continues with forming sacrificial spacers 30 upon gate stacks 16 and fin portions 120 (block 258). In certain embodiments, a first portion 32 of sacrificial spacer 30 may be formed upon a first sidewall of gate stack 16 and a first sidewall of fin portion 120. A second portion 34 of sacrificial spacer 30 may be formed upon an opposing sidewall of gate stack 16 and an opposing sidewall of fin portion 120, respectively.

Method 250 continues, with forming mask 60 within open-area 45 upon upper surface of fin base 130 between gate stack 16 pair 22 (block 260). In certain embodiments, mask 60 may be a local protection layer used in subsequent stages of semiconductor device fabrication. In certain embodiments, mask 60 is formed between respective sacrificial spacers 30 portions associated with pair 22 within pitch 26.

Method 250 continues with selectively removing sacrificial spacers 30 to expose gate stacks 16, fin portion 120, upper surface of fin base 130, and mask 60 (block 262). In certain embodiments, first portion 32 of sacrificial spacer 30 and second portion 34 of sacrificial spacer 30 are selectively removed from gate stack 16 sidewalls, fin portion 120 sidewalls, upper surface of fin base 130, and mask 60.

Method 250 continues with forming recess regions 150 and recess regions 155 (block 264). In certain embodiments, recess regions 150 and recess regions 155 may be formed by removing portions of fins 12 to create recessed dummy fin 25 and fin segments 80. Method 250 continues with removing mask 60 from recessed dummy fin 25 (block 266). In certain embodiments, recessed dummy fin 25 serves as a filler, partial filler, etc. and adds additional epitaxial growth planes within pitch 26 for the epitaxial merging of neighboring fin segments 80.

Method 250 continues with growing epitaxy 14 to merge fin segments 80 and recessed dummy fin 25 (block 268). In certain embodiments, epitaxy 14 is epitaxially grown upon fin segment 80 and recessed dummy fin 25 sidewalls and fills recess regions 150 and recess regions 155 thereby merging fin segments 80, recessed dummy fin 25, etc. Method 250 ends at block 270.

Figure 20:
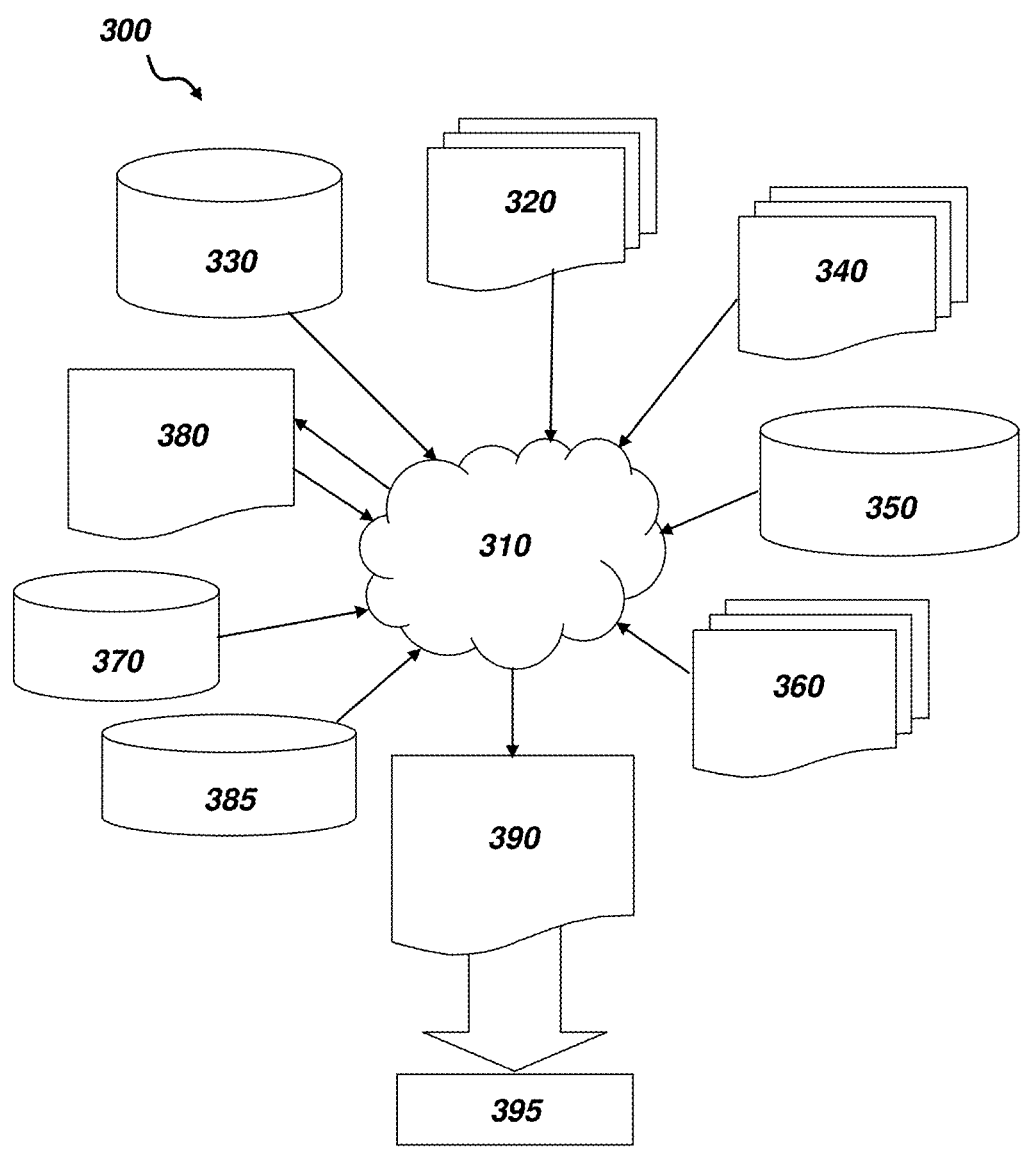
FIG. 20 depicts a flow diagram of a design process used in semiconductor design, manufacture, and/or test, in accordance with various embodiments of the present invention.

Referring now to FIG. 20, a block diagram of an exemplary design flow 300 used for example, in semiconductor integrated circuit (IC) logic design, simulation, test, layout, and/or manufacture is shown. Design flow 300 includes processes, machines and/or mechanisms for processing design structures or devices to generate logically or otherwise functionally equivalent representations of the structures and/or devices described above and shown in FIGS. 1-17.

The design structures processed and/or generated by design flow 300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 300 may vary depending on the type of representation being designed. For example, a design flow 300 for building an application specific IC (ASIC) may differ from a design flow 300 for designing a standard component or from a design flow 300 for instantiating the design into a programmable array, for example a programmable gate array (PGA) or a field programmable gate array (FPGA) offered by Altera® Inc. or Xilinx® Inc.

FIG. 20 illustrates multiple such design structures including an input design structure 320 that is preferably processed by a design process 310. Design structure 320 may be a logical simulation design structure generated and processed by design process 310 to produce a logically equivalent functional representation of a hardware device. Design structure 320 may also or alternatively comprise data and/or program instructions that when processed by design process 310, generate a functional representation of the physical structure of a hardware device. Whether representing functional and/or structural design features, design structure 320 may be generated using electronic computer-aided design (ECAD) such as implemented by a core developer/designer.

When encoded on a machine-readable data transmission, gate array, or storage medium, design structure 320 may be accessed and processed by one or more hardware and/or software modules within design process 310 to simulate or otherwise functionally represent an electronic component, circuit, electronic or logic module, apparatus, device, structure, or system such as those shown in FIGS. 1-17. As such, design structure 320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 310 preferably employs and incorporates hardware and/or software modules for synthesizing, translating, or otherwise processing a design/simulation functional equivalent of the components, circuits, devices, or structures shown FIGS. 1-17 to generate a Netlist 380 which may contain design structures such as design structure 320. Netlist 380 may comprise, for example, compiled or otherwise processed data structures representing a list of wires, discrete components, logic gates, control circuits, I/O devices, models, etc. that describes the connections to other elements and circuits in an integrated circuit design. Netlist 380 may be synthesized using an iterative process in which netlist 380 is resynthesized one or more times depending on design specifications and parameters for the device. As with other design structure types described herein, netlist 380 may be recorded on a machine-readable data storage medium or programmed into a programmable gate array. The storage medium may be a non-volatile storage medium such as a magnetic or optical disk drive, a programmable gate array, a compact flash, or other flash memory. Additionally, or in the alternative, the storage medium may be a system or cache memory, buffer space, or electrically or optically conductive devices in which data packets may be intermediately stored.

Design process 310 may include hardware and software modules for processing a variety of input data structure types including Netlist 380. Such data structure types may reside, for example, within library elements 330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 340, characterization data 350, verification data 360, design rules 370, and test data files 385 which may include input test patterns, output test results, and other testing information. Design process 310 may further include, for example, standard mechanical design processes such as stress analysis, thermal analysis, mechanical event simulation, process simulation for operations such as casting, molding, and die press forming, etc.

One of ordinary skill in the art of mechanical design can appreciate the extent of possible mechanical design tools and applications used in design process 310 without deviating from the scope and spirit of the invention claimed herein. Design process 310 may also include modules for performing standard circuit design processes such as timing analysis, verification, design rule checking, place and route operations, etc.

Design process 310 employs and incorporates logic and physical design tools such as HDL compilers and simulation model build tools to process design structure 320 together with some or all of the depicted supporting data structures along with any additional mechanical design or data (if applicable), to generate a second design structure 390. Design structure 390 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures).

Similar to design structure 320, design structure 390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-17. In one embodiment, design structure 390 may comprise a compiled, executable HDL simulation model that functionally simulates the devices shown in FIGS. 1-17.

Design structure 390 may also employ a data format used for the exchange of layout data of integrated circuits and/or symbolic data format (e.g. information stored in a GDSII (GDS2), GL1, OASIS, map files, or any other suitable format for storing such design data structures). Design structure 390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-17. Design structure 390 may then proceed to a stage 395 where, for example, design structure 390: proceeds to tape-out, is released to manufacturing, is released to a mask house, is sent to another design house, is sent back to the customer, etc.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

References herein to terms such as "vertical", "horizontal", etc. are made by way of example, and not by way of limitation, to establish a frame of reference. The term "horizontal" as used herein is defined as a plane parallel to the conventional plane or surface of the substrate, regardless of the actual spatial orientation of the semiconductor substrate. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The invention claimed is:

1. A semiconductor device comprising:
   a semiconductor substrate;
   a fin upon the semiconductor substrate, the fin comprising a dummy fin between a first fin segment pair separated by a first pitch and recess regions separating the dummy fin from respective fin segments of the first fin segment pair;
   a plurality of gates perpendicular to the fin, each gate upon a particular fin segment; and
   merged epitaxy within the recess regions connecting the dummy fin and respective fin segments of the first fin segment pair.

2. The semiconductor device of claim 1, wherein upper surfaces of the first fin segment pair are coplanar with an upper surface of the dummy fin.

3. The semiconductor device of claim 1, wherein the fin further comprises:
   a second fin segment pair separated by a second pitch.

4. The semiconductor device of claim 3, wherein the second pitch is less than the first pitch.

5. The semiconductor device of claim 1, wherein the dummy fin serves as a filler between the first fin segment pair.

6. The semiconductor device of claim 1, wherein the dummy fin adds epitaxial growth planes within the first pitch.

7. The semiconductor device of claim 1, wherein the dummy fin is not associated with a gate.

8. The semiconductor device of claim 1, wherein the dummy fin width is equal to a width of an adjacent fin segment.

9. The semiconductor device of claim 1, wherein the dummy fin width is greater than a width of an adjacent fin segment.

10. The semiconductor device of claim 1, wherein the dummy fin width is less than a width of an adjacent fin segment.

11. A semiconductor device comprising:
    a partially recessed semiconductor substrate;
    a fin upon the partially recessed semiconductor substrate, the fin comprising a dummy fin between a first fin segment pair separated by a first pitch and recess regions separating the dummy fin from respective fin segments of the first fin segment pair;
    a plurality of gates perpendicular to the fin, each gate upon a particular fin segment; and
    merged epitaxy within the recess regions connecting the dummy fin and respective fin segments of the first fin segment pair.

12. The semiconductor device of claim 11, wherein upper surfaces of the first fin segment pair are coplanar with an upper surface of the dummy fin.

13. The semiconductor device of claim 11, wherein the fin further comprises:
    a second fin segment pair separated by a second pitch.

14. The semiconductor device of claim 13, wherein the second pitch is less than the first pitch.

15. The semiconductor device of claim 11, wherein the dummy fin serves as a filler between the first fin segment pair.

16. The semiconductor device of claim 11, wherein the dummy fin adds epitaxial growth planes within the first pitch.

17. The semiconductor device of claim 11, wherein the dummy fin is not associated with a gate.

18. The semiconductor device of claim 11, wherein the dummy fin width is equal to a width of an adjacent fin segment.

19. The semiconductor device of claim 11, wherein the dummy fin width is greater than a width of an adjacent fin segment.

20. The semiconductor device of claim 11, wherein the dummy fin width is less than a width of an adjacent fin segment.

* * * * *